(12) United States Patent
Yamazaki et al.

(10) Patent No.: US 6,307,286 B1
(45) Date of Patent: Oct. 23, 2001

(54) SUPER MAGNETOSTRICTIVE ACTUATOR

(75) Inventors: Hideharu Yamazaki; Akifumi Otaka; Hiroyuki Goto, all of Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/515,512

(22) Filed: Feb. 29, 2000

(30) Foreign Application Priority Data

Mar. 5, 1999 (JP) .................................................. 11-58677

(51) Int. Cl.[7] .............................. H02N 2/00; H01L 41/12
(52) U.S. Cl. ...................... 310/26; 123/472; 251/129.01; 335/215
(58) Field of Search ............................ 310/26; 335/215; 251/129.01, 129.02, 129.03, 129.04, 129.05, 129.06; 239/102.2, 533.2, 533.3, 533.4, 533.9; 123/472, 494; 318/118

(56) References Cited

U.S. PATENT DOCUMENTS

| | | | |
|---|---|---|---|
| 4,804,314 | * | 2/1989 | Cusack .................................... 310/26 |
| 5,332,942 | * | 7/1994 | Rennex .................................. 310/328 |
| 5,361,053 | * | 11/1994 | Hosokawa et al. .................... 335/215 |
| 5,868,375 | * | 2/1999 | Reinicke et al. .................. 251/129.21 |

FOREIGN PATENT DOCUMENTS 4-168984   6/1992   (JP) .............................. H01L/41/08

* cited by examiner

Primary Examiner—Burton S. Mullins
(74) Attorney, Agent, or Firm—Arent Fox Kintner Plotkin & Kahn, PLLC

(57) ABSTRACT

A super magnetostrictive actuator includes: a magnetic field generating unit, at least first and second super magnetostrictive members extensible in a longitudinal direction thereof due to action of magnetic field generated by the magnetic field generating unit, and a coupling member having a cylindrical shape and disposed coaxially between the first and second super magnetostrictive members. The second super mangetostrictive member has a cylindrical shape and is coaxially disposed to surround the outside of the first super magnetostrictive member in a radial direction thereof. Both end portions of the coupling member are coupled to one end portion of the first super magnetostrictive member and one end portion of the second super magnetostrictive member, respectively.

6 Claims, 5 Drawing Sheets

SUPER MAGNETOSTRICTIVE ACTUATOR

BACKGROUND OF THE INVENTION

1. Field of the Invention

The present invention relates to a super magnetostrictive actuator formed by combining at least two super magnetostrictive materials which extend and shrink in the longitudinal direction thereof due to the action of the magnetic field generated by a magnetic field generation means.

2. Description of the Related Art

Of the magnetostrictive materials which generate distortion in the magnetic field, rare earth metal monocrystal such as Tb (terbium), Dy (dysprosium) or the like known as super magnetostrictive material generates enormous magnetostriction which is about several hundred times as that generated by general magnetostrictive material such as Ni, Co or the like. Since $TbFe_2$ or $DyFe_2$ which is a binary alloy of Tb and Fe or Dy and Fe is able to generate enormous magnetostriction in the room temperature, such a binary alloy is used as a source for driving an actuator. However, enormous magnetostriction generated by such super magnetostrictive materials only exceeds the displacement of about 0.1% at most. Thus, in order to secure a required output displacement while avoiding the enlargement of the size of the actuator, it is required to combine a plurality of super magnetostrictive materials so as to accumulate slight extension and shrinkage amounts of the respective super magnetostrictive materials thereby to output the accumulated displacement.

Such a super magnetostrictive actuator for securing a required output displacement by combining a plurality of super magnetostrictive materials in this manner is known as disclosed in Japanese Patent Unexamined Publication NO. Hei.4-168984.

However, the aforesaid conventional super magnetostrictive a actuator is arranged in a manner that a plurality of super magnetostrictive materials formed in a column shape are disposed along the inner periphery of a coil formed in a cylindrical shape, and the end portions of the adjacent super magnetostrictive materials are coupled to each other by a link which is supported at its center portion by a fulcrum. According to the actuator thus arranged, an amount of extension and shrinkage of each of the super magnetostrictive materials is transmitted to the adjacent super magnetostrictive material through the link mechanism thereby to generate a required output displacement between the super magnetostrictive materials positioned at both ends.

However, in the conventional actuator, since the plurality of super magnetostrictive materials are coupled by the link mechanism, the number of the parts such as the link member and the fulcrum thereof etc. increases and the number of assembling processes thereof also increases. As a result, the cost of the actuator increases, and further the actuator may be prevented from moving smoothly since the magnitude of friction and the degree of wobble at a movable portion and a sliding portion increase.

SUMMARY OF THE INVENTION

The present invention has been made in view of the aforesaid conventional circumstances, and an object of the present invention is to provide a super magnetostrictive actuator which can obtain sufficient output displacement and operate smoothly with a simple and small-sized configuration having small number of parts.

In order to attain the aforesaid object, according to the present invention, there is provided a super magnetostrictive actuator formed by combining at least first and second super magnetostrictive materials which expand and shrink in a longitudinal direction thereof due to action of magnetic field generated by magnetic field generating means. The second magnetostrictive material of tubular shape is disposed coaxially so as to surround outer side of the first magnetostrictive material along radial direction thereof, and a coupling member of tubular shape disposed coaxially between the first and second super magnetostrictive materials is coupled at its both end portions to one end portion of the first magnetostrictive material and one end portion of the second magnetostrictive material, respectively.

According to the aforesaid configuration, when the magnetic field generating means generates magnetic field, both the first and second super magnetostrictive materials extend and shrink in the axial direction and so the deviation at the one end portion of the first magnetostrictive material is transmitted to the one end portion of the second magnetostrictive material through the coupling member. Thus, the deviation corresponding to the sum of amounts of extension/shrinkage of the first and second super magnetostrictive materials can be generated between the other end portion of the first magnetostrictive material and the other end portion of the second magnetostrictive material. Further, since the coupling member of tubular shape is disposed coaxially so as to surround the outer side of the first magnetostrictive material along the radial direction thereof and the second magnetostrictive material of tubular shape is disposed coaxially so as to surround the outer side of the coupling member along the radial direction thereof, not only can the super magnetostrictive actuator be configured in a small size but also the extension/shrinkage of the first and second super magnetostrictive materials can be effectively transmitted without causing offset load of the first and second super magnetostrictive materials. Furthermore, since the coupling member does not have a fulcrum nor a sliding portion and is merely coupled at its both end portions to the first and second super magnetostrictive materials, respectively, the number of the parts can be reduced thereby to realize a simple configuration and so the actuator is advantageous in economical efficiency, endurance and assembling efficiency.

Further, the magnetic field generating means may be formed by a coil disposed coaxially so as to surround the outer periphery of the second magnetostrictive material.

According to the aforesaid configuration, the output deviation of the super magnetostrictive actuator can be easily controlled by merely changing the pulse width or the magnitude of the current supplied to the coil. Further, since all the first and second super magnetostrictive materials, the coupling member and the coil are disposed coaxially, the super magnetostrictive actuator can be further configured in a smaller size.

DETAILED DESCRIPTION OF THE PREFERRED EMBODIMENTS

A first embodiment of the present invention will be explained with reference to FIGS. 1 to 4.

Figure 1:
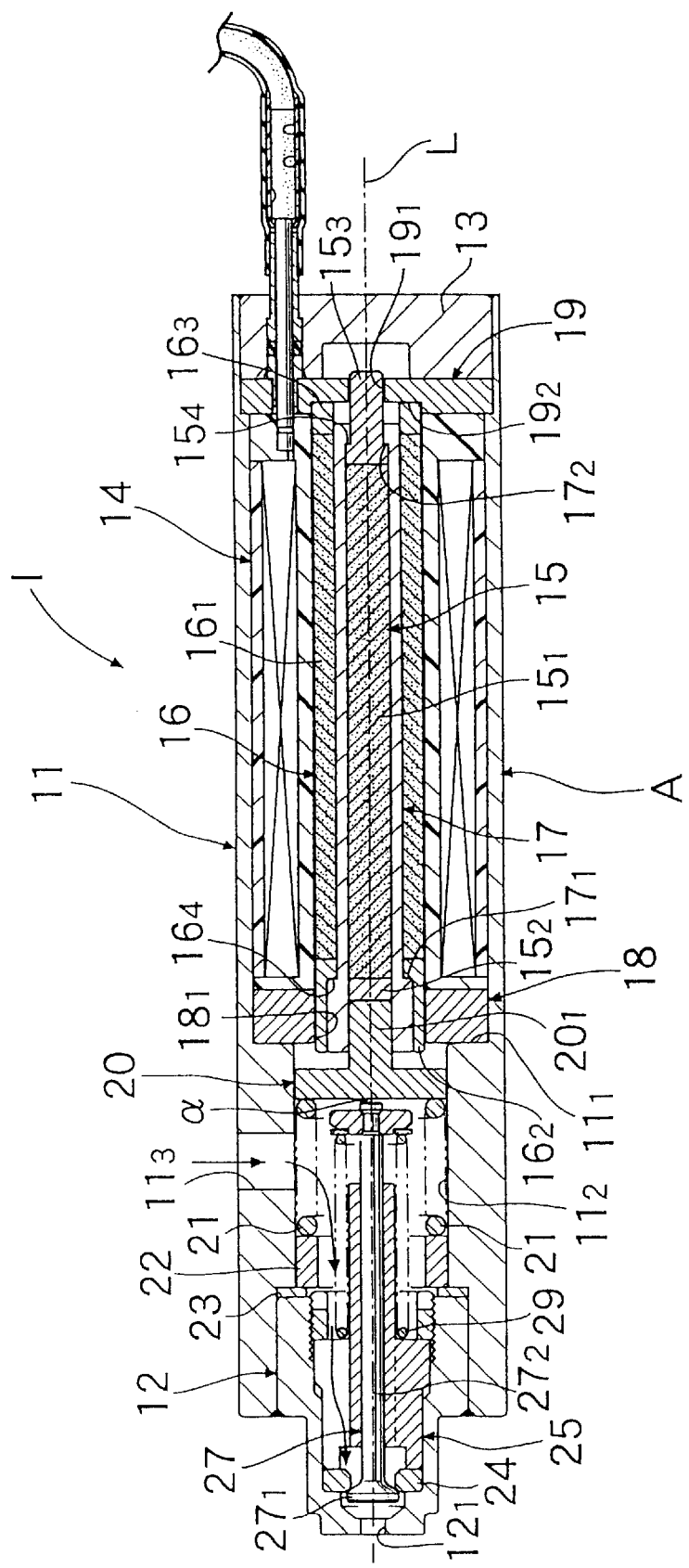
FIG. 1 is a longitudinal sectional view of a fuel injection valve.

As shown in FIG. 1, a fuel injection valve I used in a direct injection engine for natural gas includes a housing 11 of substantially cylindrical shape. A nozzle 12 and a cap 13 are fixed to the front end portion and the rear end portion of the housing 11, respectively. The super magnetostrictive actuator A received in the rear portion of the housing 11 includes, so as to drive the fuel injection valve I, a coil 14 serving as a magnetic field generating means, a first magnetostrictive material 15, a second magnetostrictive material 16 and a coupling member 17. The front end of the coil 14 which is formed in a cylindrical shape and fits in the inner peripheral surface of the housing 11 engages with the step portion $11_1$ of the housing 11 through a front guide member 18 having a guide hole $18_1$. The rear end of the coil 14 is engaged with the front surface of the cap 13 through a rear guide member 19 having a guide hole $19_1$ and a stopper surface $19_2$.

Figure 4:
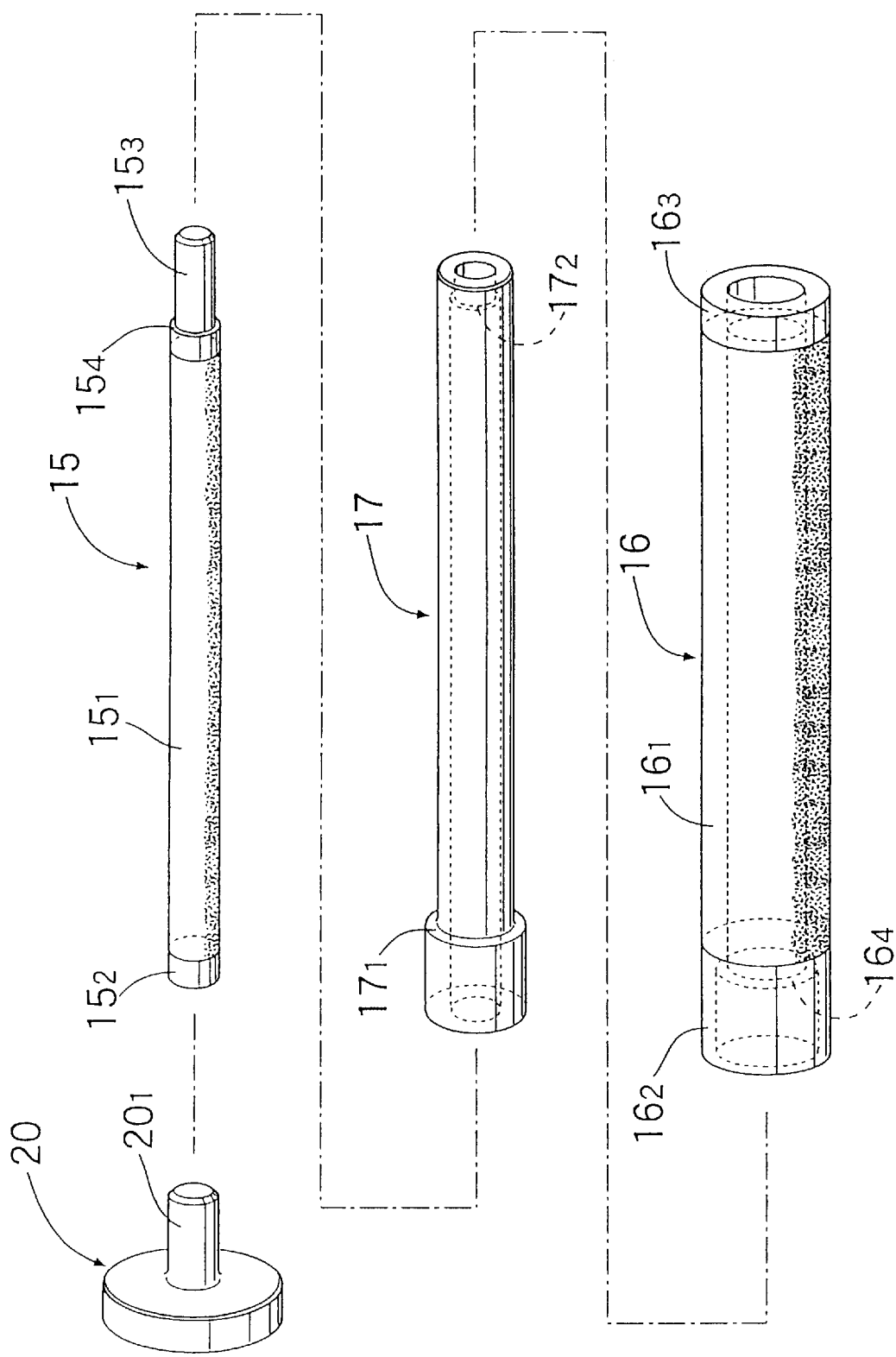
FIG. 4 is a fragmental perspective view of the main portion of a super magnetostrictive actuator.

As clear also with reference to FIG. 4, the first magnetostrictive material 15 is configured by a super magnetostrictive material main body $15_1$ formed in a column shape, and a front end member $15_2$ and a rear end member $15_3$ fixed to the front end and the rear end of the super magnetostrictive material main body $15_1$, respectively. A step portion $15_4$ is formed at the outer peripheral surface of the rear end member $15_3$. The second magnetostrictive material 16 is configured by a super magnetostrictive material main body $16_1$ formed in a cylindrical shape, and a front end member $16_2$ and a rear end member $16_3$ fixed to the front end and the rear end of the super magnetostrictive material main body $16_1$, respectively. A step portion $16_4$ is formed at the inner peripheral surface of the front end member $16_2$. The coupling member 17 made of non-magnetic material and formed in substantially cylindrical shape has a step portion $17_1$ at the outer peripheral surface of the front end side thereof and a step portion $17_2$ at the inner peripheral surface of the rear end side thereof.

The second magnetostrictive material 16 is disposed at the inner side of the coil 14 which is fitted into and supported by the housing 11. The coupling member 17 is disposed at the inner side of the second super magnetostrictive material 16. The first magnetostrictive material 15 is disposed at the inner side of the coupling member 17. In this state, the housing 11, the coil 14, the second magnetostrictive material 16, the coupling member 17 and the first magnetostrictive material 15 are aligned concentrically with respect to the axial line L of the fuel injection valve I.

The rear end member $16_3$ of the second magnetostrictive material 16 abuts against the stopper surface $19_2$ of the rear guide member 19 and positioned thereat. The front end member $16_2$ slidably fits into the inner peripheral surface of the guide hole $18_1$ of the front guide member 18. The step portion $16_4$ of the front end member $16_2$ of the second magnetostrictive material 16 engages with the step portion $17_1$ of the front side of the coupling member 17. The step portion $17_2$ of the rear side of the coupling member 17 engages with the step portion $15_4$ of the rear end member $15_3$ of the first magnetostrictive material 15. In this case, the rear end member $15_3$ of the first magnetostrictive material 15 slidably fits into the guide hole $19_1$ of the rear guide member 19.

The super magnetostrictive material main body $15_1$ of the first magnetostrictive material 15 and the super magnetostrictive material main body $16_1$ of the second magnetostrictive material 16 are formed by Terfenol-D (trade name), for example. The Terfenol-D is an alloy formed by combining $TbFe_2$ and $DyFe_2$. The alloy comprises from 27% to 30% of $TbFe_2$, and 70% to 73% of $DyFe_2$, and the content of Fe in the alloy is from 19% to 20%. The Terfenol-D has such a property of the positive magnetostriction (extend with respect to the direction of the magnetic field) and the magnetic anisotropic constant is approximately 0.

Figure 2:
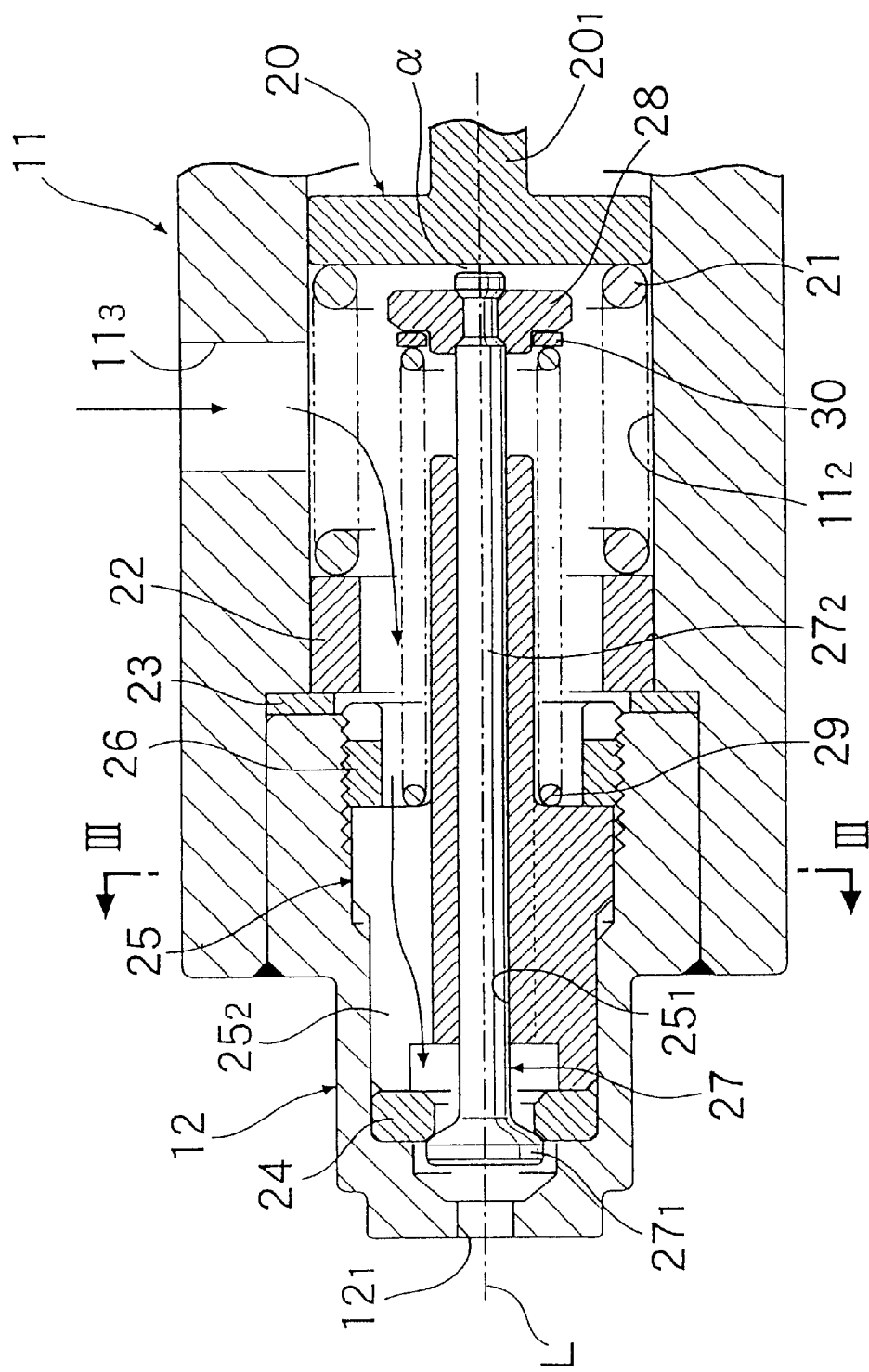
FIG. 2 is an enlarged diagram of the main portion of FIG. 1.
Figure 3:
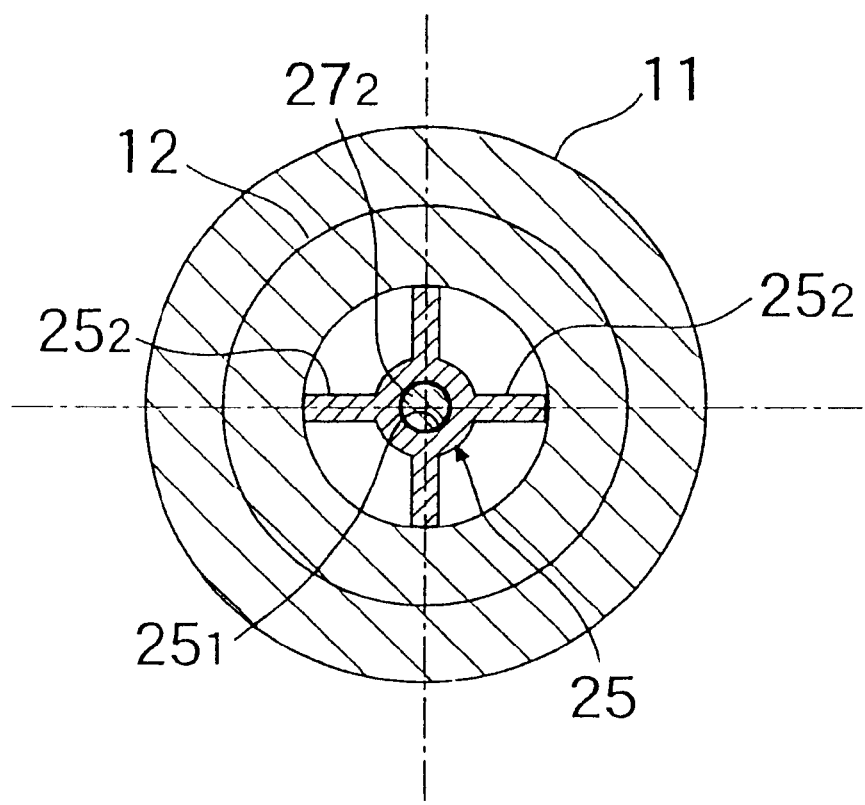
FIG. 3 is a sectional diagram taken along a line III—III in FIG. 2.

As clear also with reference to FIGS. 2 and 3, a piston 20 serving as an output member is slidably fitted into a cylinder $11_2$ formed at the inner periphery of the front portion of the housing 11. A piston rod $20_1$ extending backward from the piston 20 abuts against the front end member $15_2$ of the first magnetostrictive material 15. The front end of a preload spring 21 received within the cylinder $11_2$ engages with the rear end of the nozzle 12 through a collar 22 and a washer 23 and the rear end of the preload spring 21 retains with the front surface of the piston 20. Thus, the piston 20 is biased backward due to the elastic force of the preload spring 21 applied thereto.

A valve seat 24 and a valve element support member 25 are received within the nozzle 12 having a nozzle hole $12_1$ at the tip end thereof. A nut 26 having screws formed at the outer peripheral surface thereof is screwed around the inner peripheral surface of the nozzle 12, so as to fix the valve seat 24 and the valve element support member 25. The valve element support member 25 has a guide hole $25_1$ which penetrates at the center portion thereof along the axial direction therethrough and four ribs $25_2$ which are formed with an angular interval of 90 degrees and extend radially to the radial direction. The outer ends of the ribs $25_2$ are abutted against the inner peripheral surface of the nozzle 12, so that the valve element support member 25 is positioned to the radial direction. A valve element 27 has a head portion $27_1$ and a shaft portion $27_2$. The head portion $27_1$ is capable of being seated on the front surface of the valve seat 24 and the shaft portion $27_2$ is slidably supported by the guide hole $25_1$ of the valve element support member 25. A spring seat 28 is provided at the rear end of the shaft portion $27_2$ of the valve element 27. A valve spring 29 is supported between the front surface of the spring seat 28 and the valve element support member 25 in a compressed state. The head portion $27_1$ of the valve element 27 is biased backward by the valve spring 29 and then seated on the valve seat 24.

A shim 30 is attached between the rear end of the valve spring 29 and the spring seat 28. An amount of the preload of the valve spring 29 can be adjusted by changing the thickness of the shim 30.

A fuel supply hole $11_3$ is formed at the front portion of the housing 11. The highly-pressurized fuel supplied into the cylinder $11_2$ from the fuel supply hole $11_3$ passes among the four ribs $25_2$ and further passes a clearance between the valve seat 24 and the head portion $27_1$ of the valve element 27 and then injected into the cylinder of the engine from the nozzle hole $12_1$.

The action of the fuel injection valve I thus configured will be explained.

When the piston 20 is biased backward by the elastic force of the preload spring 21 received within the cylinder $11_2$ in the compressed state, the compressed preload to the axial direction acts on the first magnetostrictive material 15 whose front end member $15_2$ is pressed by the piston rod $20_1$. The compressed preload acting on the first magnetostrictive material 15 is transmitted from the step portion $15_4$ of the rear end member $15_3$ to the step portion $17_2$ of the rear side of the coupling member 17 thereby to bias the coupling member 17 backward. The biasing force for biasing the coupling member 17 backward is transmitted from the step portion $17_1$ of the front side of the coupling member 17 to the step portion $16_4$ of the front end member $16_2$ of the second magnetostrictive material 16. As a result, the compressed preload in the axial direction acts on the second magnetostrictive material 16 whose rear end member 16₃ is retained by the rear guide member 19. Each of the first magnetostrictive material 15 and the second magnetostrictive material 16 is applied with the compressed preload in the axial direction and shrinks in the axial direction in accordance with the magnitude of the compressed preload.

When the coil 14 is not supplied with current, the valve element 27 is biased backward by the valve spring 29 and hence the head portion 27₁ of the valve element 27 is seated on the valve seat 24. In this case, a clearances α (see FIG. 2) with a preset size is formed between the front surface of the piston 20 and the rear end of the shaft portion 27₂ of the valve element 27 so that the head portion 27₁ of the valve element 27 is not interfered from being seated on the valve seat 24.

When the coil 14 of the super magnetostrictive actuator A is supplied with current in accordance with an instruction from a fuel injection amount control apparatus so as to supply fuel to the engine, the first magnetostrictive material 15 and the second magnetostrictive material 16 extend against the compressed preload in accordance with the magnitude of the magnetic field generated by the coil 14. As for the second magnetostrictive material 16 whose rear end member 16₃ is retained by the rear guide member 19, the front end member 16₂ moves forward by the extension of the super magnetostrictive material main body 16₁ thereby to move forward the coupling member 17 whose step portion 17₁ of the front side of the coupling member 17 is retained by the step portion 16₄ of the front end member 16₂. The displacement force for moving the coupling member 17 forward is transmitted from the step portion 17₂ of the rear side of the coupling member 17 to the step portion 15₄ of the rear end member 15₃ of the first magnetostrictive material 15. As a result, the rear end member 15₃ of the first magnetostrictive material 15 moves forward by the length corresponding to the extended length of the second magnetostrictive material 16. Further, since the super magnetostrictive material main body 15₁ of the first magnetostrictive material 15 extends against the compressed preload in accordance with the magnitude of the magnetic field generated by the coil 14, the front end member 15₂ of the first magnetostrictive material 15 moves forward with respect to the rear end member 15₃.

In this manner, the piston 20 moves forward by the length corresponding to the sum of the extended length of the first magnetostrictive material 15 and that of the second magnetostrictive material 16. When the piston 20 moves forward, the clearances α between the front surface of the piston 20 and the rear end of the shaft portion 27₂ of the valve element 27 becomes shorter, and so the valve element 27 pushed by the piston 20 moves forward against the elastic force of the valve spring 29, whereby the head portion 27₁ of the valve element 27 separates from the valve seat 24. As a consequence, the highly-pressurized fuel having been supplied into the cylinder 11₂ from the fuel supply hole 11₃ passes the clearance between the valve seat 24 and the head portion 27₁ of the valve element 27 and then is injected from the nozzle hole 12₁. Thus, an amount of fuel injection can be controlled in such a manner that the current supplied to the coil 14 is subjected to the pulse width control thereby to change the opened/closed periods of the clearance between the valve seat 24 and the head portion 27₁ of the valve element 27, or in such a manner that the magnitude of the current supplied to the coil 14 is controlled thereby to change the size of the clearance between the valve seat 24 and the head portion 27₁ of the valve element 27.

As described above, since the first magnetostrictive material 15, the coupling member 17, the second magnetostrictive material 16 and the coil 14 are coaxially disposed around the axial line L so as to be sequentially overlapped in this order from the inside to the outside along the radial direction, the super magnetostrictive actuator A can be formed in a compact size. Further, since all the weight of the first magnetostrictive material 15, the coupling member 17 and the second magnetostrictive material 16 acts on the axial line L, asymmetrical deformation around the axial line L of the first magnetostrictive material 15, the coupling member 17 and the second magnetostrictive material 16 can be prevented and the weight is efficiently transmitted, so that the smoothing operation of the super magnetostrictive actuator A can be secured. Furthermore, since the coupling member 17 does not have a fulcrum nor a sliding portion, the configuration thereof is quite simple. Accordingly, it becomes possible to reduce the number of the parts and the number of the assembling processes, and further the durability of the actuator can be improved and the rate of failure thereof can be reduced. Furthermore, since the coil 14 is employed as the magnetic field generating means, the output displacement of the super magnetostrictive actuator A can be easily and accurately controlled by merely changing the pulse width or the magnitude of the current supplied thereto.

When the coil 14 is supplied with current and the super magnetostrictive actuator A is operated, since the elastic force of the valve spring 29 in addition to the elastic force of the preload spring 21 simultaneously acts the first magnetostrictive material 15 and the second magnetostrictive material 16, the sum of the elastic force of both the preload spring 21 and the valve spring 29 influences the dynamic characteristic of the super magnetostrictive actuator A. As a method of adjusting the sum of the elastic force, there are considered a first method of adjusting both the elastic force of the preload spring 21 and the elastic force of the valve spring 29, a second method of adjusting only the elastic force of the preload spring 21, and a third method of adjusting only the elastic force of the valve spring 29.

However, when the elastic force of the preload spring 21 is changed, since the amount of shrinkage of the first magnetostrictive material 15 and the second magnetostrictive material 16 due to the preload changes, the clearances α between the front surface of the piston 20 and the rear end of the shaft portion 27₂ of the valve element 27 changes, so that new adjustment such as the replacement of the valve element 27 is required. Accordingly, the first and second methods including the changing of the elastic force of the preload spring 21 are not preferable. In contrast, according to the third method of adjusting only the elastic force of the valve spring 29, since the elastic force of the valve spring 29 is not transmitted to the first magnetostrictive material 15 nor the second magnetostrictive material 16 at the time where the super magnetostrictive actuator A is not operated, there arises no problem that the size of the clearance α changes.

That is, when the elastic force of the preload spring 21 is preset at a value capable of obtaining the desired clearances α and the elastic force of the valve spring 29 is adjusted by changing the thickness of the shim 30 in this state, the sum of the elastic force of the preload spring 21 and the valve spring 29 can be adjusted to a magnitude capable of obtaining a target dynamic characteristic. Further, in this case, the size of the clearance α does not change irrespective of the adjustment of the elastic force of the valve spring 29. In this manner, the dynamic characteristic of the super magnetostrictive actuator A can be adjusted easily without changing the size of the clearance α by such a simple procedure of merely changing the thickness of the shim 30 supporting the one end of the valve spring 29.

Figure 5:
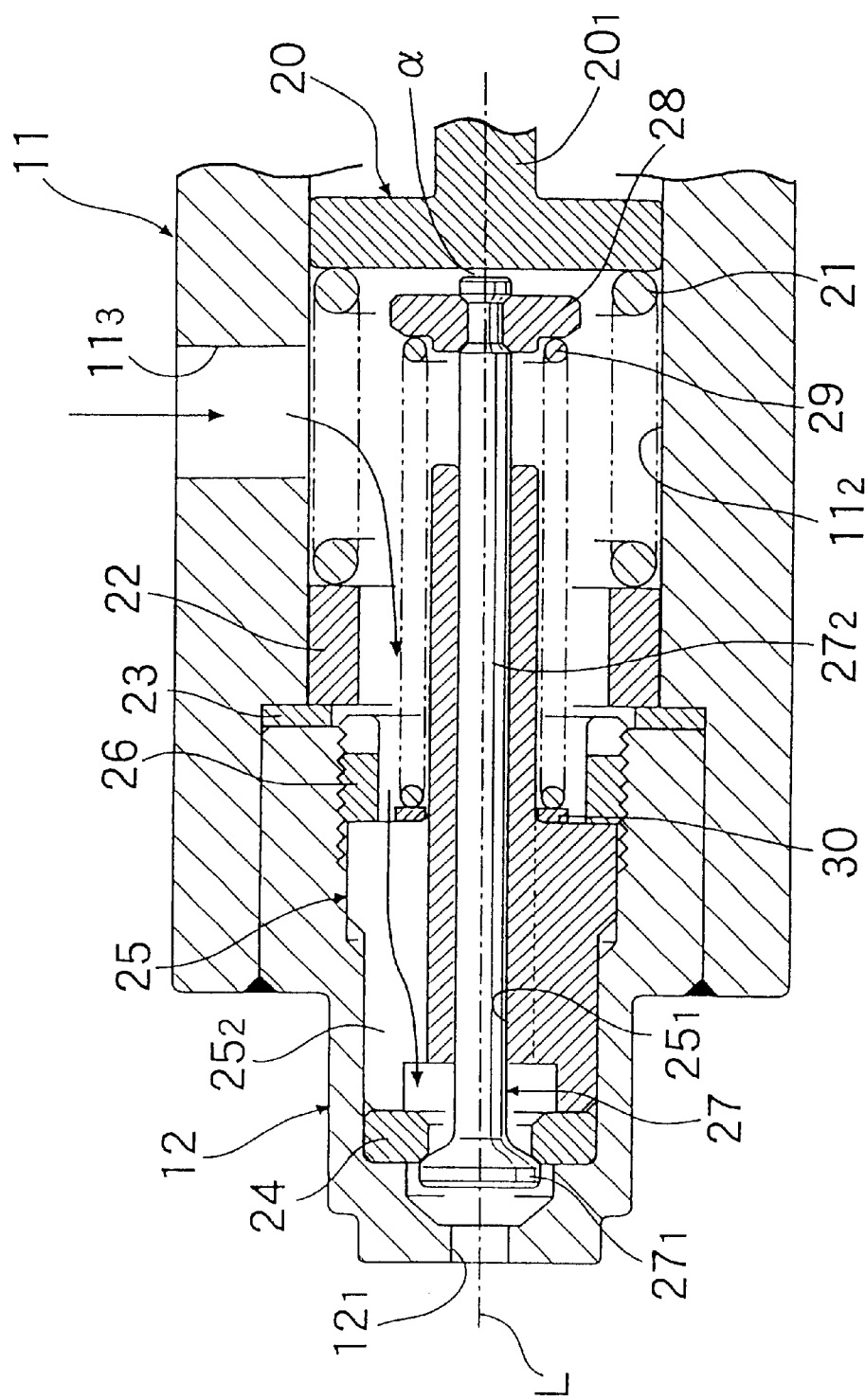
FIG. 5 is a diagram showing the second embodiment of the present invention which corresponds to FIG. 2.

Although in the first embodiment, the shim 30 is disposed between the rear end of the valve spring 29 and the front surface of the piston 20, the shim 30 may be disposed between the front end of the valve spring 29 and the rear surface of the valve element support member 25 like the second embodiment shown in FIG. 5. In such a modification, the same function and effects as in the first embodiment can be obtained.

Although the detailed explanation has been made as to the embodiments of the present invention, the present invention may be subjected to various changes of the design in a range of so as not to deviate from the gist of the present invention.

For example, although the explanation is made as to the example where the present invention is applied to the super magnetostrictive actuator A for the fuel injection valve I, the present invention may be applied to a super magnetostrictive actuator for other arbitrary usage.

What is claimed is:

1. A super magnetostrictive actuator, comprising:

a magnetic field generating means;

at least first and second super magnetostrictive members extensible in a longitudinal direction thereof due to action of a magnetic field generated by said magnetic field generating means, said second super mangetostrictive member having a cylindrical shape and being coaxially disposed to surround around the outside of said first super magnetostrictive member in a radial direction thereof; and a coupling member having a cylindrical shape and disposed coaxially between said first and second super magnetostrictive members, wherein both end portions of said coupling member are coupled to one end portion of said first super magnetostrictive member and one end portion of said second super magnetostrictive member, respectively.

2. A super magnetostrictive actuator according to claim 1, wherein said magnetic field generating means is disposed coaxially so as to surround an outer periphery of said second super magnetostrictive member.

3. A super magnetostrictive actuator according to claim 1, wherein said magnetic field generating means is formed by a coil disposed coaxially so as to surround an outer periphery of said second super magnetostrictive member.

4. A super magnetostrictive actuator according to claim 1, wherein said first and second super magnetostrictive members are formed of an alloy including rare earth metal monocrystal.

5. A super magnetostrictive actuator according to claim 1, wherein said coupling member is formed of non-magnetic material.

6. A super magnetostrictive actuator according to claim 1, further comprising:

a housing, wherein one of the other end portions of said first and second super mangetostrictive members is positioned adjacent to said housing, and the other of the other end portions of said first and second super magnetostrictive members is movable with respect to said housing in said longitudinal direction.

* * * * *